United States Patent [19]

Tauber et al.

[11] Patent Number: 5,110,767
[45] Date of Patent: May 5, 1992

[54] METHOD OF DEPOSITING A SUPERCONDUCTING FILM BY ELECTROPHORESIS

[75] Inventors: Arthur Tauber, Elberon; Robert D. Finnegan, West Long Branch; Michelle A. Dornath Mohr, Freehold; Frank A. McBride, Browns Mills, all of N.J.

[73] Assignee: The United States of America as represented by the Secretary of the Army, Washington, D.C.

[21] Appl. No.: 749,816

[22] Filed: Aug. 26, 1991

[51] Int. Cl.$^5$ .................... H01B 12/00; H01L 39/12; B01D 57/02
[52] U.S. Cl. .................... 505/1; 204/180.1; 204/192.17
[58] Field of Search ............ 204/180.1, 192.24, 181.4, 204/181.5, 192.17; 505/1

[56] References Cited

U.S. PATENT DOCUMENTS

| | | | |
|---|---|---|---|
| 4,810,339 | 3/1989 | Heavens et al. | 204/180.1 |
| 4,939,308 | 7/1990 | Maxfield et al. | 505/1 |
| 4,975,417 | 12/1990 | Koura | 505/1 |

Primary Examiner—John Niebling
Assistant Examiner—Caroline Koestner
Attorney, Agent, or Firm—Michael Zelenka; Roy E. Gordon

[57] ABSTRACT

A superconducting film of $HoBa_2Cu_3O_{7-x}$ on a substrate is obtained from a mixture containing stoichiometric amounts of $Ho_2O_3$, $BaCO_3$ and $CuO$ powders by a method including the steps of (A) processing the powder mixture to an average particle size of about 2 to 3 $\mu m$,
(B) adding about three grams of the powder to about 25 cc of an organic dispersant,
(C) depositing the powder in the organic dispersant on the substrate by electrophoresis in electric fields of about 100 to about 1000 volts/cm for about 3 to about 15 minutes to obtain superconducting films having a thickness of about 5 to about 25 $\mu m$; and
(D) sintering and annealing in oxygen.

1 Claim, No Drawings

METHOD OF DEPOSITING A SUPERCONDUCTING FILM BY ELECTROPHORESIS

GOVERNMENT INTEREST

The invention described herein may be manufactured, used, and licensed by or for the Government for governmental purposes without the payment to us of any royalty thereon.

FIELD OF THE INVENTION

This invention relates in general to a method of depositing a superconducting film onto a substrate and in particular to a method of depositing a superconducting film of $HoBa_2Cu_3O_{7-x}$(Ho-1,2,3) onto a substrate of $YBa_2Cu_3O_{7-x}$Y-1,2,3).

BACKGROUND OF THE INVENTION $HoBa_2Cu_3O_{7-x}$(Ho-1,2,3) has interesting possibilities as a superconducting film by virtue of the anisotropic susceptability believed present in it. However, to date, Ho-1,2,3 has only been made in bulk.

SUMMARY OF THE INVENTION

The general object of this invention is to provide a method of depositing a superconducting film onto a substrate. A particular object of the invention is to provide a method of depositing a superconducting film of Ho-1,2,3 onto a substrate. A still more particular object of the invention is to provide a method of depositing a superconducting film of Ho-1,2,3 onto a substrate of Y-1,2,3.

It has now been found that the aforementioned objects can be attained by a method of depositing a superconducting film of Ho-1,2,3 on a substrate of Y-1,2,3 from a mixture containing stoichiometric amounts of $Ho_2O_3$, $BaCO_3$ and $CuO$ powders including the steps of (A) processing the powder mixture to an average particle size of about 2 to 3 $\mu m$, (B) adding about three grams of the powder to about 25 cc of an organic dispersant, (C) depositing the powder from the organic dispersant onto a substrate of Y-1,2,3 by electrophoresis in electric fields of about 100 to about 1000 volts/cm for about 3 to about 15 minutes to obtain a superconducting film having a thickness of about 5 to 25 $\mu m$; and (D) sintering and annealing in oxygen.

As the term electrophoresis is meant the deposition of a neutral particle that acquires a charge upon suspension in an insulating dispersant and migrates to an electrode under the acceleration due to an electric field.

According to the method of the invention, thick or thin films of high $T_c$ superconductors can be obtained. The method of the invention enables the deposition of thin or thick films onto substrates that can be used for microwave devices, SMEPS, shielding of magnetic fields and the fabrication of wire.

The method of the invention provides for the conformal coating of any surface or substrate that is an electrical conductor. The method also provides for orientation of films in a magnetic field by virtue of the anisotropic susceptibility present in Ho-1,2,3.

The starting Ho-1,2,3 powder can be processed for example by mixing stoichiometric amounts of $Ho_2O_3$, $BaCO_3$ and $CuO$ and either precalcining the intimately mixed powders in air, inert gas, or vacuum at 850° to 900° C. for 10 to 15 hours; then slow cooling to 100° and removing from the furnace several times with intermediate grinding and pelletizing. In the alternative, the mixture can be wetted with dilute nitric acid in a porcelain casserole or evaporation dish, heated to dryness and decomposed at 600° C. Subsequently, the cake is reground and calcined several times in air. Finally, the powder can be pressed into thin pellets and sintered at 930° C. for ten to 20 hours, cooled to 650° C. in oxygen, held for ten hours, cooled to 450° C., held for ten hours and cooled to 100° C. and removed. The pellets are subsequently micromilled (100 to $-25$ $\mu m$) and jet milled twice to yield an average particle size of 2 to 3 $\mu m$. This powder is then stored under dry nitrogen until needed.

In the method of the invention, four organic dispersants are used: acetone, ethanol, butanol and butyl acetate. Of these, acetone is preferred because it is easiest to use because of its volatility. However, all work about equally well. Three grams of powder is added to 25 cc of the organic dispersant.

The electrophoresis is carried out in a cell that can fit between the poles of an electromagnet and be subject to a dc magnetic field of 2 Tesla during deposition. A satisfactory dimension for the cell is found to be 3/16 inch in width so that it can fit into the ¼ inch gap of the magnet. The cell is made from KEL-F plastic that is not affected by the organic dispersants used. Other plastics that can be used include polypropylene and polyurethane.

Following electrophoretic deposition, the films are dried for 1 hour at 120° C. in air. The films are then sintered for 30 minutes in the hot zone of a furnace preheated to 920° C. They are then pulled into the cool zone and the hot zone cooled to 450° C. The films are then returned to the hot zone for 2 hours and then allowed to furnace cool. Sintering and annealing are done in flowing $O_2$.

DESCRIPTION OF THE PREFERRED EMBODIMENT

Electrophoretic deposition is carried out in electric fields of 100 to 1000 volts/cm for times of 3 to 15 minutes. This yields films ranging in thickness from 5 to 25 $\mu m$. Thicker films can be obtained for longer times. The currents range typically from hundreds of microamps to thousands of microamps during deposition. The current typically falls rapidly, then slowly, as a function of deposition elapsed time.

The substrates that the films can be deposited on include sapphire, MgO single crystal substrates that are coated with silver or gold and Y-1,2,3 substrates. Preferred is the Y-1,2,3 substrate where chemical contamination of the film can be held to a minimum.

DC resistance curves have been obtained on some samples with sharp transitions between 85 and 90° K. Surface resistance measurements at about 35 GHz have yielded values as low as 32 milliohms at 6° K. Cu under the same conditions has a surface resistance of 23 m ohms.

We wish it to be understood that we do not desire to be limited to the axact details of construction shown and described for obvious modifications will occur to a person skilled in the art.

What is claimed is:

1. Method of depositing a superconducting film of $HoBa_2Cu_3O_{7-x}$ on a substrate of $YBa_2Cu_3O_{7-x}$ from a mixture containing stoichiometric amounts of $Ho_2O_3$, $BaCO_3$ and CuO powders including the steps of
(A) processing the powder mixture using milling and sintering techniques to an average particle size of about 2 to 3 μm,
(B) adding about three grams of the powder to about 25 cc of acetone,
(B) depositing the powder in the acetone by electrophoresis in electric fields of about 100 to about 1000 volta/cm for about 3 to about 15 minutes to obtain superconducting films having a thickness of 5 to 25 μm; and
(D) sintering and annealing in oxygen.

* * * * *